(12) United States Patent
Grutzeck et al.

(10) Patent No.: US 10,795,149 B2
(45) Date of Patent: Oct. 6, 2020

(54) MICROMIRROR DEVICE HAVING A MECHANICAL STOP

(71) Applicant: Robert Bosch GmbH, Stuttgart (DE)

(72) Inventors: Helmut Grutzeck, Kusterdingen (DE); Peter Sudy, Szentgal (HU); Andreas Finn, Tuebingen (DE); Daniel Maier, Stuttgart (DE)

(73) Assignee: Robert Bosch GmbH, Stuttgart (DE)

( * ) Notice: Subject to any disclaimer, the term of this patent is extended or adjusted under 35 U.S.C. 154(b) by 59 days.

(21) Appl. No.: 15/986,973

(22) Filed: May 23, 2018

(65) Prior Publication Data

US 2018/0341102 A1 Nov. 29, 2018

(30) Foreign Application Priority Data

May 24, 2017 (DE) .................. 10 2017 208 855

(51) Int. Cl.
*G02B 26/08* (2006.01)
*B81B 3/00* (2006.01)
*G02B 27/00* (2006.01)

(52) U.S. Cl.
CPC ........ *G02B 26/0833* (2013.01); *B81B 3/0051* (2013.01); *G02B 26/085* (2013.01); *G02B 27/0006* (2013.01); *B81B 2201/042* (2013.01); *B81B 2203/0163* (2013.01)

(58) Field of Classification Search
CPC .............. G02B 26/0833; G02B 26/085; G02B 27/0006; B81B 3/0051; B81B 2203/0163; B81B 2201/042
USPC ........................................................ 359/225.1
See application file for complete search history.

(56) References Cited

U.S. PATENT DOCUMENTS

| 8,169,678 B2* | 5/2012 | Hofmann | G02B 26/0841 359/221.2 |
| 9,753,280 B2* | 9/2017 | Hofmann | G02B 26/0833 |
| 2010/0296151 A1* | 11/2010 | Hofmann | G02B 26/0841 359/291 |

FOREIGN PATENT DOCUMENTS

DE 102010064218 A1 6/2012

* cited by examiner

*Primary Examiner* — Euncha P Cherry
(74) *Attorney, Agent, or Firm* — Norton Rose Fulbright US LLP; Gerard Messina

(57) ABSTRACT

A micromirror device having a cap, a function layer, and a window layer, which are disposed on top of one another and parallel to a main extension plane, the function layer being situated between the cap and the window layer, and a micromirror is patterned out of the function layer. The micromirror device has a stop, which is designed to restrict a deflection of the micromirror in a direction perpendicular to the main extension plane.

5 Claims, 4 Drawing Sheets

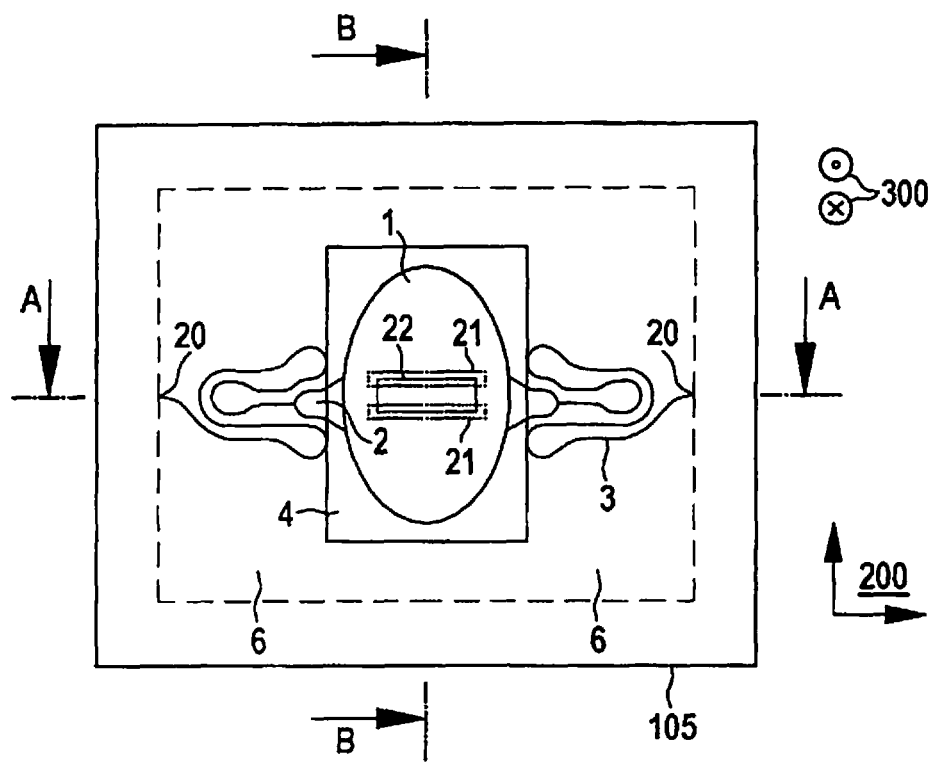
Fig. 1
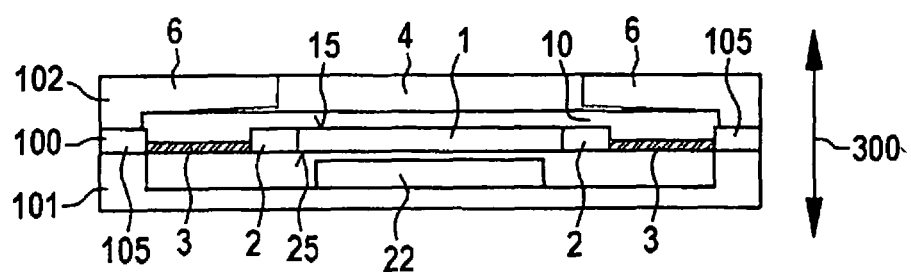
Fig. 2 (Section A-A)

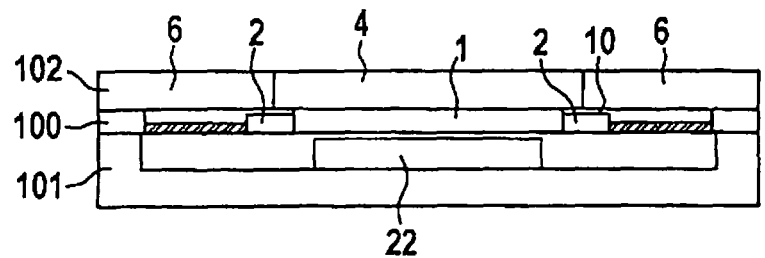
Fig. 3 (Section A-A)
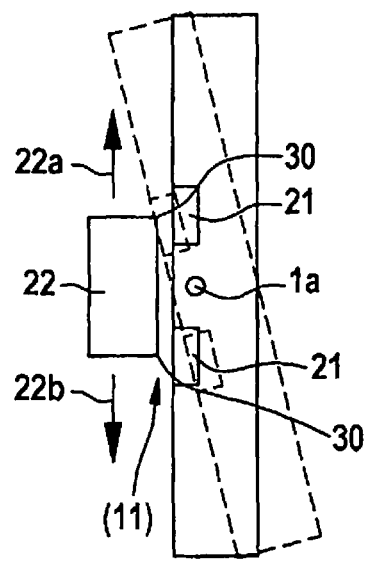
Fig. 4 (Section B-B)

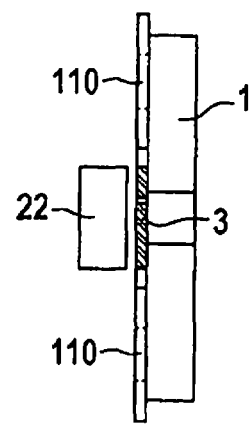
Fig. 7 ( side view C-C)
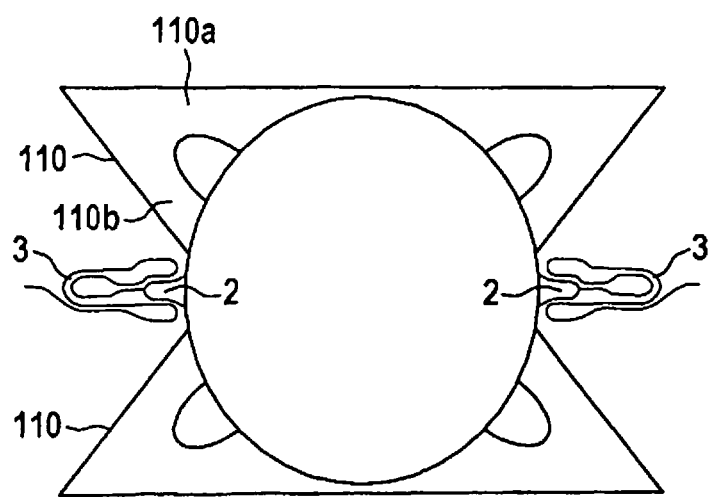
Fig. 8

MICROMIRROR DEVICE HAVING A MECHANICAL STOP

CROSS REFERENCE

The present application claims the benefit under 35 U.S.C. § 119 of German Patent Application No. DE 102017208855.9 filed on May 24, 2017, which is expressly incorporated herein by reference in its entirety.

BACKGROUND INFORMATION

The present invention relates to a micromirror device having a cap, a function layer, and a window layer, which are situated on top of one another and parallel to a main extension plane, the function layer being situated between the cap and the window layer and a micromirror being patterned out of the function layer.

Spring designs for suspending a mirror are described in German Patent Application No. DE 102010064218 A1.

SUMMARY

An object of the present invention is to provide a micromirror that is robust with respect to mechanical shocks, in particular in the case of a free fall including an impact.

The present invention relates to a micromirror device having a cap, a function layer, and a window layer, which are situated on top of one another and parallel to a main extension plane, the function layer being situated between the cap and the window layer and a micromirror being patterned out of the function layer. In accordance with the present invention, the micromirror device has a stop, which is designed to restrict a deflection of the micromirror in a direction perpendicular to the main extension plane.

One advantageous development of the present invention provides that the stop is situated on the cap, between the micromirror and the cap.

It is particularly advantageous if the stop is situated on the cap in such a way that a mirror-pivot axis of the micromirror and the stop are situated in an overlapping fashion in the direction perpendicular to the main extension plane.

It is also particularly advantageous if a recess is situated in the micromirror at a rear side of the micromirror that lies opposite from the stop, in such a way that a stop edge of the stop is able to dip into the recess if the micromirror is rotated about the pivot axis of the mirror.

One advantageous development of the present invention provides that the stop is formed in the function layer and that it connects the micromirror to a suspension spring.

It is especially advantageous if a window and a surrounding window frame are developed in the window layer and that the stop is developed in such a way that the window frame and the stop are situated in an overlapping manner in the direction perpendicular to the main extension plane.

The design features described in the present invention allow for an advantageous stop design, in particular perpendicular to the lateral extension of the mirror. The stops are meant to protect the mirror, and in particular the spring of the mirror, in the event of an overload (a fall with an impact or vibration).

According to FIG. 2, a deflectable mirror having three design elements is advantageously constructed, i.e., a function layer having a spring and mirror plane, a cap, which protects the spring and the mirror from dirt and mechanical effects on the rear side, and a window layer having an optical window that allows the beam to be deflected to enter and leave again, optionally provided with a transparent window material for the beams to be deflected.

BRIEF DESCRIPTION OF THE DRAWINGS

FIG. 1 schematically shows an exemplary embodiment of a micromirror device according to the present invention in a plan view.

FIG. 2 schematically shows an exemplary embodiment of a micromirror device according to the present invention in section AA of FIG. 1.

FIG. 3 schematically shows another exemplary embodiment of a micromirror device according to the present invention in section AA of FIG. 1.

FIG. 4 schematically and in the form of a cutaway shows a further exemplary embodiment of a micromirror device according to the present invention in section BB of FIG. 1.

FIG. 7 shows the exemplary embodiment of a micromirror device according to the present invention having a robust coil carrier, in section C of FIG. 6.

FIG. 8 schematically shows a plan view of an exemplary embodiment of a micromirror device according to the present invention having a mass-reduced coil carrier.

DETAILED DESCRIPTION OF EXAMPLE EMBODIMENTS

Figure 5:
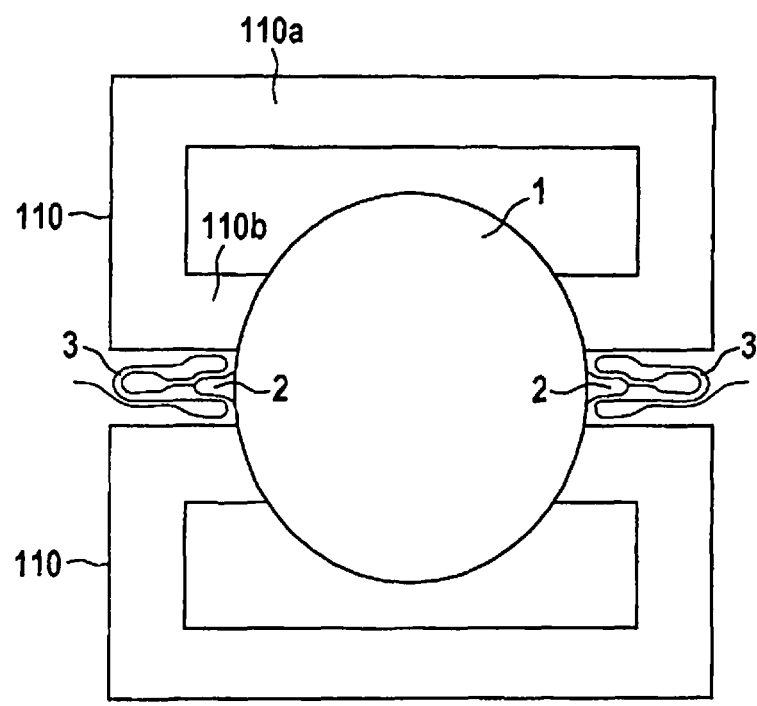
FIG. 5 shows a micromirror device having a coil carrier in the related art.

FIG. 1 schematically shows a plan view of an exemplary embodiment of a micromirror device according to the present invention. Shown is a micromirror device having a cap 101, a function layer 100, and a window layer 102, which are situated on top of one another and parallel to a main extension plane 200. Function layer 100 is situated between cap 101 and window layer 102. A micromirror 1 is patterned out of function layer 100. The micromirror device has a mechanical stop 2 on micromirror 1, which is designed to restrict a deflection of micromirror 1 in a direction 300 perpendicular to main extension plane 200, in particular against the edge of window 4. FIG. 1 shows a suspension spring 3 that makes it possible to apply the mechanical stop in the form of a central stop 2 in the case of a mirror 1. This central stop is able to strike optical window frame 6 situated above when the mirror is subject to considerable accelerations or vibrations, for example. To develop this spring, it has to be wound around stop 2 in a form that is illustrated in FIG. 1 in order to give the springs a design that requires little space. The springs are attached to an external frame/a substrate 105 at location 20.

FIG. 2 schematically shows an exemplary embodiment of a micromirror device according to the present invention in section AA of FIG. 1. Shown is a micromirror device having a cap 101, a function layer 100, and a window layer 102, which are situated on top of one another and parallel to a main extension plane 200. Function layer 100 is situated between cap 101 and window layer 102. A micromirror 1 is patterned out of function layer 100. The micromirror device has a mechanical stop in the form of a central stop 2. The central placement of stop 2 close to or directly in the main pivot axis of the micromirror allows for small gap dimensions 10 that allow a rotation of mirror 1 (and thus of stops 2) but permit only a small spring travel in the case of an abrupt acceleration perpendicular to the lateral mirror extension. The movement clearance is able to be adjusted in two ways; either a corresponding clearance must be reserved in the window (FIG. 2), or the stop is reset from the mirror plane in terms of process engineering (FIG. 3). The exemplary embodiment from FIG. 2 has the advantage that stop 2 is not weakened in the mirror area. Instead, a window frame 6 is patterned into window layer 102 that includes window 4, which has an additional recess for creating clearance 10 between window frame 6 and stop 2. In addition, the micromirror device also has a mechanical stop in the form of a stop 22 on cap 101.

FIG. 3 schematically illustrates another exemplary embodiment of a micromirror device according to the present invention in section AA of FIG. 1. In this example, stop 2 is recessed from the mirror plane using process technology.

FIG. 4 schematically shows a further exemplary embodiment of a micromirror device according to the present invention in a cutaway view in section BB of FIG. 1. FIG. 4 in particular shows a stop development whose action is directed toward the opposite plane. Only mirror 1 and stop 22 of the entire micromirror device are shown in this figure. Cap 101, on which stop 22 is situated, is not illustrated. Since cap 101 is often subject to greater tolerances for production-related reasons, it is difficult to bring it into the vicinity of pivot axis 1a of the mirror. To allow stop 22, which is integrated into the cap, to be moved as closely as possible to mirror 1, recesses 21 have been produced in the mirror itself. These recesses may be developed to have lower tolerances in relation to the position of the mirror. This prevents mirror 1 from being touched at stop edge 30 in an intentional deflection. If stop 22 is not placed in its exact setpoint position (or in other words, if its position is shifted in direction 22a or 22b), then the non-centered part still projects only into the recess without any impact. This makes it possible to minimize gap 11 and provides the aforementioned advantages.

Mechanical stops 2 and 22 may be provided on the micromirror in combination, as described in the previous text, or also individually.

FIG. 5 shows a micromirror device having a coil carrier in the related art. Depicted is a micromirror device that has two coil carriers 110 for the electromagnetic drive. A separate coil (not shown here) is mounted on the coil carrier and contacted by way of springs 3. Mirror 1 is able to be deflected by the force effects of the Lorentz force under an external magnetic field, e.g., of a permanent magnet or an external coil, and when an electric current is applied to the coil on coil carrier 110. Coil carriers 110 have an external coil carrier 110a and an internal coil carrier 100b in each case. Internal coil carrier 110b is directly and mechanically firmly connected to mirror 1. External coil carrier 110a is retained only by internal coil carrier 110b.

Figure 6:
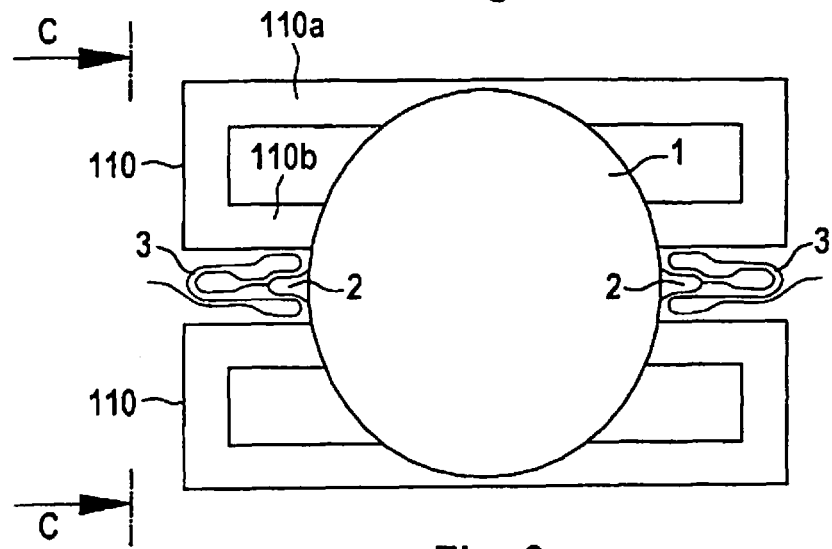
FIG. 6 schematically shows a plan view of an exemplary embodiment of a micromirror device according to the present invention, which has a robust coil carrier.

FIG. 6 schematically shows a plan view of an exemplary embodiment of a micromirror device according to the present invention including a robust coil carrier. In contrast to the device from FIG. 5, both external coil carrier 110a and internal coil carrier 110b are directly and mechanically firmly connected to mirror 1. This makes coil carrier 110 particularly robust with respect to mechanical shocks as they may be produced by falls or when the micromirror strikes a stop, for example. The described development of the micromirror device thereby improves the stability in the event of a fall and results in a stabilization of coil carrier 110. In this instance, external coil carrier 110a is connected to internal coil carrier 110b through an appropriate dimensioning of the coil and mirror, which thus stabilizes external coil carrier 110a with respect to stresses due to falls and knocks.

In addition, the higher modes (natural frequencies of the oscillations of the micromirror device) are upwardly shifted in their frequency range, which improves the controllability of the coil deflection.

FIG. 7 shows a side view C of FIG. 6 of the exemplary embodiment of a micromirror device according to the present invention having a robust coil carrier. Coil regions 110 are connected to the mirror in the lower part of the mirror, i.e. are mechanically firmly connected to mirror 1.

FIG. 8 schematically shows a plan view of an exemplary embodiment of a micromirror device according to the present invention including a mass-reduced coil carrier. Another possibility for increasing the robustness with regard to falls is shown in FIG. 8. In this instance, coil carrier 110 is developed in a trapezoidal shape, which leads to a further increase in the robustness with regard to falls because of the savings in mass. In addition, the trapezoidal shape results in a better behavior at the higher mechanical natural oscillations.

LIST OF REFERENCE NUMERALS

1 Mirror
1a Pivot axis of the mirror
2 Stop (stopper) in the function layer
3 Suspension spring
4 Window
6 Window frame
10 Clearance, gap dimension
15 Front side of the mirror
20 Spring connection at the outer frame/substrate
21 Recess in mirror
22 Stop (stopper) on the cap
22a, 22b Faulty placement of the stopper
25 Rear side of the mirror
30 Stop edge
100 Function layer (spring and mirror plane)
101 Cap
102 Window layer
105 External frame/substrate
110 Coil carrier
110a External coil carrier
110b Internal coil carrier
200 Main extension plane
300 Direction perpendicular to the main extension plane

What is claimed is:
1. A micromirror device, comprising:
a cap;
a function layer; and
a window layer,
wherein the cap, the function layer and the window layer are situated on top of one another and parallel to a main extension plane, the function layer situated between the cap and the window layer, and a micromirror patterned out of the function layer;
wherein the micromirror device has a stop, which is configured to restrict a deflection of the micromirror in a direction perpendicular to the main extension plane,
wherein a window frame patterned into the window layer is situated above the stop, wherein the stop is configured to strike the window frame,
wherein the window layer includes a window which has a recess for creating a clearance between the window frame and the stop, wherein the stop is developed in such a way that the window frame and the stop are disposed in an overlapping manner in the direction perpendicular to the main extension plane.

2. The micromirror device as recited in claim 1, wherein the stop is situated on the cap and between the micromirror and the cap.

3. The micromirror device as recited in claim 2, wherein the stop is disposed on the cap such that a mirror-pivot axis of the micromirror and the stop are situated in an overlapping manner in the direction perpendicular to the main extension plane.

4. The micromirror device as recited in claim 2, wherein a recess is disposed in the micromirror on a rear side of the micromirror that lies opposite from the stop, in such a way that a stop edge of the stop is able to dip into the recess when the micromirror is rotated about the mirror-pivot axis.

5. The micromirror device as recited in claim 1, wherein the stop is formed in the function layer and connects the micromirror to a suspension spring.

* * * * *